United States Patent [19]

Hino et al.

[11] Patent Number: 5,019,222

[45] Date of Patent: May 28, 1991

[54] TREATMENT OF COPPER FOIL FOR PRINTED CIRCUITS

[75] Inventors: Eiji Hino; Keisuke Yamanishi, both of Hitachi, Japan

[73] Assignee: Nikko Gould Foil Co., Ltd., Tokyo, Japan

[21] Appl. No.: 515,927

[22] Filed: Apr. 27, 1990

[30] Foreign Application Priority Data

May 2, 1989 [JP] Japan .................................. 1-112226
May 2, 1989 [JP] Japan .................................. 1-112227

[51] Int. Cl.$^5$ .......................... C25D 3/58; C25D 7/06
[52] U.S. Cl. ..................... 204/27; 204/35.1; 204/44
[58] Field of Search ........................ 204/27, 35.1, 44

[56] References Cited

U.S. PATENT DOCUMENTS 4,131,517 12/1978 Mitsuo ................................ 204/27

Primary Examiner—T. M. Tufariello
Attorney, Agent, or Firm—Seidel, Gonda, Lavorgna & Monaco

[57] ABSTRACT

A process for the treatment of a copper foil for printed circuits comprises forming, over the surface of the copper foil to be treated, of an electroplating alloy deposit selected from the group consisting of electroplating deposits of binary alloys composed of 20–40 mg/dm$^2$ copper and 100–3000 μg/dm$^2$ cobalt and of ternary alloys of 20–40 mg/dm$^2$ copper, 100–3000 μg/dm$^2$ cobalt, and 100–1000 μg/dm$^2$ nickel. The copper foil treated has heat resistance, peel strength, and resistance to hydrochloric acid comparable to the Cu-Ni-treated foils. It can be etched with a CuCl$_2$ etchant to form 150 μm or finer-pitch printed circuits and is also etchable with alkalies. Its magnetizability is below the permissible upper limit.

4 Claims, No Drawings

TREATMENT OF COPPER FOIL FOR PRINTED CIRCUITS

FIELD OF THE INVENTION

This invention relates to the treatment of a copper foil for printed circuits, and more specifically to a treatment whereby a copper foil for printed circuits having good heat resistance and adaptability for alkali etching plus only limited magnetizability can be produced. The copper foil treated in accordance with the invention is particularly suited for use in fine-pattern printed circuits and flexible printed circuits (FPC) for magnetic heads.

BACKGROUND OF THE INVENTION

Copper foils for printed circuits commonly are laminated to a substrate of synthetic resin or the like at elevated temperature and pressure, printed with the pattern of a desired circuit, and unwanted portions are etched away. Finally, necessary elements are mounted or attached in place by soldering to form various printed circuit boards for electronic devices.

Qualitative requirements for the copper foil to be used in a printed wiring board vary with the sides of the resin substrate to which the foil is joined (so called "matte side" which has roughened surface) and not joined (so called "shiny side" which has glossy surface). It is important to satisfy the requirements for the both sides. Major requirements for the matte side are:

(1) No possibility of tarnishing with oxidation while in storage.

(2) Adequate resistance to peeling from the substrate even after high-temperature heating, wet treatment, soldering, chemical treatment, etc.

(3) Freedom from so-called stains or defect spots after lamination operation which may result from foil lamination to the substrate or from etching.

Conditions required of the shiny side include:

(1) Sound outward appearance and no tarnishing due to oxidation in storage.

(2) Good solder wettability.

(3) No oxidative discoloration on heating at elevated temperature.

(4) High adhesion to resist materials for producing printed circuits.

To meet these requirements, many different treatments have hitherto been introduced for the copper foils for printed wiring boards. The treatments differ with whether the foils are rolled or electrolytic. One process established as a useful approach consists of pretreating a degreased copper foil by plating, roughening, or the like as needed, alloy plating so as to produce a desired copper foil surface, treating the plated surface for corrosion prevention, and, where necessary, further treating the surface with silane coupling agent and further annealing.

The alloy plating is the key of the process which determines the surface properties of the resulting copper foil. The applicant has already proposed and gained some success in two treatments at typical alloy plating techniques. One was a Cu-Ni treatment (Japanese Patent Application Public Disclosure No. 145769/1987) and the other was a Cu-Co treatment (Japanese Patent Application Publication No. 2158/1988).

The Cu-Ni treatment imparts excellent peel strength (heat resistance and resistance to hydrochloric acid). On the other hand, the treated surface is difficult to etch, even with a copper chloride ($CuCl_2$) etchant, and is not suitable for printed circuits of 150 μm or finer pitches. Moreover, it cannot be etched with any alkali etching solution.

The Cu-Co treatment permits etching with a $CuCl_2$ etchant to form 150 μm or finer-pitch printed circuits and also allows alkali etching. The treated surface is inferior, however, in the point of peel strength (heat resistance and hydrochloric acid resistance) to the Cu-Ni-treated surface.

More recent tendencies toward finer patterning and diversification of printed circuitry have given rise to the requirements that (i) peel strength (heat resistance and hydrochloric acid resistance) comparable to those of the Cu-Ni-treated be attained, and (ii) etching with the $CuCl_2$ etchant be possible to provide 150 μm or finer-pitch printed circuits, and alkali etching too be feasible.

Specifically, the finer the circuit pattern the easier the circuit is to peel off by the action of the hydrochloric acid etchant, rendering it necessary to take some step against the peeling. The finer-patterned circuits also tend to be peeled off by the high temperature during soldering, again necessitating a preventive measure. With the tendency toward finer patterns, it is now imperative that etching with a $CuCl_2$ etchant be possible to provide 150 μm or finer-pitch printed circuits. The advent of new, diverse resists is also making alkali etching more and more essential.

Still another factor of importance (iii) is the magnetizability of the printed circuit. This is attracting increasing attention because the advent of higher-performance printed circuits and their expanding use, especially as FPC for magnetic heads, have more often designed the location of the circuits close to magnetic media than before. For such applications highly magnetizable alloys typified by conventional Cu-Co alloys cannot be used. Their saturation magnetization, remanent magnetization, and coercivity must be limited below predetermined levels.

OBJECT OF THE INVENTION

The present invention has for its object the provision of a copper foil for printed circuits which, in addition to possessing the afore-described many general characteristics as such, meets the requirements of (i) peel strength (heat resistance and hydrochloric acid resistance) comparable to those of the Cu-Ni-treated be attained, (ii) etchability with the $CuCl_2$ etchant to provide 150μm or finer-pitch printed circuits and also etchability with alkalies, and (iii) magnetizability below an allowable level.

SUMMARY OF THE INVENTION

Our extensive investigations have now led to the finding that the above object is realized by the use of a copper-cobalt binary alloy with a smaller cobalt content rather than existing Cu-Co alloys. Surprisingly, with the binary alloy having a controlled cobalt content, it has now been found possible to reduce the magnetizability below the permissible upper limit while taking the most advantages of the ordinary Cu-Co alloy.

It has also been found that the above object is realized as well with a ternary alloy of copper containing given percentages of cobalt and nickel. It is the first discovery in the art that the ternary copper alloy with controlled cobalt and nickel contents can take the full advantages of the beneficial properties of Cu-Ni and Cu-Co alloys and eliminate their shortcomings. It was unforeseen that the magnetizability can be reduced below the permissible level even if cobalt is added in an amount large enough to meet the etching requirement (ii) above and that despite the addition of cobalt the same level of peel strength (heat resistance and hydrochloric acid resistance) as in the Cu-Ni alloy can be retained.

On the basis of these discoveries, the present invention provides a process for the treatment of a copper foil for printed circuits characterized by the formation, over the surface of the copper foil to be treated, of an electroplating deposit selected from the group consisting of electroplating deposits of binary alloys composed of from 20 to 40 mg/dm$^2$ copper and from 100 to 3000 $\mu$g/dm$^2$ cobalt and of ternary alloys composed of from 20 to 40 mg/dm$^2$ copper, from 100 to 3000 $\mu$g/dm$^2$ cobalt, and from 100 to 1000 $\mu$g/dm$^2$ nickel. Following the formation of the electro-plating deposit, it is desirable to treat the deposited surface for prevention of corrosion either by a film treatment with chromium oxide alone or with a mixture of chromium oxide and zinc/zinc oxide.

DETAILED DESCRIPTION OF THE INVENTION

The copper foil to be used in the present invention may be either electrolytic or rolled one.

Usually, the side of the copper foil to be joined to the substrate, or the coarse side, is treated for improved peel strength after the lamination. To this end the copper foil surface after degreasing is roughened, e.g., by nodular copper electrodeposition, which is easily accomplished by so-called burnt electrodeposition wherein the electrodeposition is conducted at a condition above a limiting current density. The roughening is sometimes preceded or followed by ordinary copper plating as a preliminary treatment or finishing, respectively. The roughening itself may be performed in any other manner known in the art. The treatment differs with whether the copper foil is rolled or electrolytic. With certain rolled copper foils the roughening step may be omitted. For the purposes of the invention such treatments are comprehensively termed "pretreatment".

This invention is concerned with the treatment of copper foil after the above pretreatment. Following the pretreatment, at least one side of the copper foil is plated to form an alloy surface imparted with many properties required as the surface for a printed circuit.

In one aspect of the invention the alloy plating is done electrolytically so as to form a binary alloy layer of 20-40 mg/dm$^2$ copper and 100-3000 $\mu$g/dm$^2$ cobalt. If the proportion of cobalt is less than 100 $\mu$g/dm$^2$, the peeling characteristics (resistance to thermal deterioration and attack of hydrochloric acid) will be low, with reduced etchability. Cobalt in excess of 3000 $\mu$g/dm$^2$ is undesirable, either, in that it brings a corresponding increase in magnetism.

The thickness of this Cu-Co binary alloy is difficult to fix unequivocally, since the copper foil surface that forms the base is not even and the true specific gravity of the resulting alloy is accurately unpredictable.

If the true specific gravities of Cu itself and Co itself are both relied upon and the base surface unevenness is disregarded, the average thickness is calculated to range between 0.2 and 0.5 $\mu$m, preferably between 0.3 and 0.4 $\mu$m. An alloy layer less than 0.2 $\mu$m thick would have reduced peel strength and decreased resistance to heat and chemical attacks. A thickness exceeding 0.5 $\mu$m would embrittle the treated layer and tend to leave unetched portions behind upon etching.

In the same way, Co content in the Cu-Co binary alloy is calculated. A Co content in the range of 1 to 10% by weight is desirable, because less than 1% deteriorates the heat resistance while more than 10% increases the influence of magnetism undesirably.

General plating bath and operating parameters for forming the binary alloy layer are as follows:

| Bath composition and plating parameters | |
|---|---|
| Cu content | 10–20 g/l |
| Co content | 1–10 g/l |
| pH | 1–4 |
| Temperature | 40–50° C. |
| Current density, $D_k$ | 20–30 A/dm$^2$ |
| Time | 1–5 sec |

The copper foil thus plated preserves the peel strength properties (thermal deterioration resistance and hydrochloric acid resistance) comparable to those of existing Cu-Co alloys although the cobalt content is substantially decreased. In addition, it can be etched with a CuCl$_2$ etchant to provide 150 $\mu$m or finer-pitch printed circuits, and the magnetizability is reduced without impairing the great advantage of being etchable with alkalies.

Alkali etchants known in the art and useful for the purposes of the invention include, e.g., the solutions of 6 mol/l NH$_4$OH, 5mol/l NH$_4$Cl, and 2 mol/l CuCl$_2$ (usual temperature: 50° C.).

In spite of the inclusion of cobalt, the magnetizability is below the permissible level. The expression "the magnetizability below the permissible level" as used herein means, according to general criteria at this point of time, a saturation magnetization $M_s$ of 160 emu/cc or below, a remanent magnetization $M_r$, of 70 emu/cc or below, and a coercivity (coercive force) $H_c$ of 300 Oe or below.

In accordance with the invention it is easy to realize a saturation magnetization $M_s$ of 50 emu/cc or below, a remanent magnetization $M_r$ of 40 emu/cc, and a coercivity $H_c$ of 220 Oe or below.

In another aspect of the invention, the alloy plating is carried out electrolytically so that a ternary alloy layer of from 20 to 40 mg copper, from 100 to 3000 $\mu$g cobalt, and from 100 to 1000 $\mu$g nickel, all per square decimeter. If the cobalt content is less than 100 $\mu$g/dm$^2$, low heat resistance and poor etchability result. If it is more than 3000 $\mu$g/dm$^2$, the influence of magnetism grows to excess. If the nickel content is less than 100 $\mu$g/dm$^2$, heat resistance decreases, whereas a nickel content of greater than 1000 $\mu$g/dm$^2$ causes a larger area to be left unetched on etching.

As for the thickness of this Cu-Co-Ni ternary alloy layer, the same applies as with the binary alloy discussed above. Using the true specific gravities of respective Cu, Co, and Ni and disregarding the base surface unevenness, the average thickness is calculated to range from 0.2 to 0.5 $\mu$m, preferably from 0.3 to 0.4 $\mu$m. An alloy layer less than 0.2 $\mu$m thick would have reduced peel strength and decreased resistance to heat and chemical attacks. A thickness exceeding 0.5 $\mu$m would embrittle the treated layer and tend to leave unetched portions behind on etching.

Similarly, the Co and Ni contents in the Cu-Co-Ni ternary alloy is calculated. A Co content in the range of 1 to 8% by weight is desirable, because less than 1% deteriorates the heat resistance while more than 8% increases the influence of magnetism undesirably. The Ni content is desired to range from 0.5 to 3% by weight. If it is below 0.5% the heat resistance and chemical resistance decrease, but if it exceeds 3% etching with alkali etchants is no longer possible. The sum of the Co and Ni contents is desired to come within the range of 200 to 4000 $\mu g/dm^2$.

General plating bath and operating parameters for forming the ternary alloy layer are as follows:

| Bath composition and plating parameters | |
|---|---|
| Cu content | 10–20 g/l |
| Co content | 1–10 g/l |
| Ni content | 1–10 g/l |
| pH | 1–4 |
| Temperature | 40–50° C. |
| Current density, $D_K$ | 20–30 A/dm$^2$ |
| Time | 1–5 sec |

The copper foil thus plated exhibits the heat resistance, peel strength, and hydrochloric acid resistance comparable to the Cu-Ni-treated foil, although the nickel content is substantially reduced and a considerable amount of cobalt is contained. In addition, it permits etching with alkalies as well as with a CuCl$_2$ etchant to provide 150 $\mu$m or finer-pitch printed circuits. In spite of the inclusion of cobalt, the magnetizability is below the permissible upper limit as defined above. Here again, a saturation magnetization $M_s$ of 50 emu/cc or below, a remanent magnetization $M_r$ of 40 emu/cc, and a coercivity $H_c$ of 220 Oe or below can be easily realized.

The binary or ternary alloy layer thus formed is then treated for corrosion prevention. Desirable corrosion-preventive treatment under the invention is coating with either chromium oxide alone or with a mixture of chromium oxide and zinc/zinc oxide. The latter consists of electroplating the alloy layer surface with a plating bath containing a zinc salt or zinc oxide and a chromate to form a corrosion-preventive coat of a zinc-chromium-base mixture composed of zinc or zinc oxide and chromium oxide. The plating bath to be used is typically an aqueous solution of a mixture consisting of at least one of bichromates, such as K$_2$Cr$_2$O$_7$, Na$_2$Cr$_2$O$_7$ and the like and CrO$_3$, at least one of water-soluble zinc salts, such as ZnO, ZnSO$_4$·7H$_2$O, and an alkali hydroxide. Typical of plating bath compositions and electrolytic conditions are as below:

| K$_2$Cr$_2$O$_7$ (or Na$_2$Cr$_2$O$_7$ or CrO$_3$) | 2–10 g/l |
|---|---|
| NaOH or KOH | 10–50 g/l |
| ZnO or ZnSO$_4$·7H$_2$O | 0.05–10 g/l |
| pH | 7–13 |
| Bath temperature | 20–80° C. |
| Current density | 0.05–5 A/dm$^2$ |
| Time | 5–30 sec |
| Anode | Pt—Ti plate, Stainless steel plate, etc. |

In the coat thus formed, the amount of chromium oxide is required to be at least 15$\mu$g/dm$^2$ in terms of chromium and the amount of zinc at least 30$\mu$g/dm$^2$. The thickness of the coat may differ with the side on which it is formed, i.e., either roughened or glossy side.

Processes for such corrosion-preventive treatment are disclosed, e.g., in Japanese Patent Application Publication Nos. 7077/1983, 33908/1986, and 14040/1987. However, their adaptability for the Cu-Co or Cu-Co-Ni alloy used under the present invention is not known yet.

More desirably, primarily with the view to promoting the bond between the copper foil and the resin substrate, at least the roughened side of the corrosion-preventive coat is subjected to silane treatment, whereby the roughened surface is coated with a silane coupling agent to form a thin film thereon. The application may be performed by spraying of a solution of silane coupling agent, by means of a coater, by dipping, curtain or flood coating, or any other means. For instance, Japanese Patent Application Publication No. 15654/1985 teaches an improvement in the bond between a copper foil and its resin substrate by chromate treatment of the roughened side of the foil followed by treatment with a silane coupling agent. Further particulars are obtained by reference to the publication.

Finally, according to the necessity, annealing may be used to improve the ductility of the copper foil. Annealing is conducted, e.g., in an oxygen-free atmosphere (O$_2 \leq$ 10 ppm at 10$^{-1}$ Torr, with the introduction of N$_2$ gas), at a temperature of 150° to 200° for 5 to 9 hours in the case of a rolled copper foil. With an electrolytic copper foil, the temperature is raised to 300° to 500°.

EXAMPLES AND COMPARATIVE EXAMPLES

A rolled copper foil was subjected to pretreatment including usual roughening, and plated with several alloys in conformity with the present invention and also for comparison purposes.

The conditions for the copper roughening treatment were as follows:

| Copper roughening | |
|---|---|
| Cu | 10–25 g/l |
| H$_2$SO$_4$ | 20–100 g/l |
| Temperature | 20–40° C. |
| $D_K$ | 30–70 A/dm$^2$ |
| Time | 1–5 sec |

The conditions for the alloy plating treatments are as follows:

| Conventional alloy plating | |
|---|---|
| Cu—Ni plating | |
| Cu | 5–10 g/l |
| Ni | 10–20 g/l |
| pH | 1–4 |
| Temperature | 20–40° C. |
| $D_K$ | 10–30 A/dm$^2$ |
| Time | 2–5 sec |
| Cu—Co (high-Co) plating | |
| Cu | 2.5 g/l |
| Co | 20 g/l |
| pH | H$_2$SO$_4$ 5 g/l |
| Temperature | 30° C. |
| $D_K$ | 7 A/dm$^2$ |
| Time | 60 sec |
| Alloy plating according to the invention | |
| 1. Cu—Co(low-Co) plating | |
| Cu | 5–25 g/l |
| Co | 3–15 g/l |
| pH | 1–4 |
| Temperature | 20–50° C. |
| $D_K$ | 10–30 A/dm$^2$ |
| Time | 2–5 sec |

-continued

| 2. Cu—Co—Ni plating | |
|---|---|
| Cu | 5–25 g/l |
| Co | 3–15 g/l |
| Ni | 3–15 g/l |
| pH | 1–4 |
| Temperature | 20–50° C. |
| $D_K$ | 10–30 A/dm$^2$ |
| Time | 2–5 sec |

These materials were finally treated against rusting and then subjected to surface layer analysis and their peel strength characteristics, magnetic properties, and etchability were evaluated.

Their magnetic properties were treated in the following manner.

Samples

Each treated foil was punched to obtain small circular samples 5.5 mm in diameter. Twenty such samples were stacked and measured with a vibrating sample magnetometer (VSM). The treated surface area S was 0.0475 dm$^2$.

Evaluation items

Saturation magnetization $M_s$, emu/cc
Remanent magnetization $M_r$, emu/cc
Coercivity (coercive force) $H_c$, Oe Measurements Hysteresis curves were drawn using a VSM manufactured by Toei Kogyo Co., and the characteristic values were read. The maximum applied magnetic field was 10 kOe. With respect to remanent magnetization and coercivity, the means of the readings on both plus and minus sides were used.

As for the peel strength, each sample was laminated and bonded to a glass cloth-based epoxy resin plate, and the normal (room-temperature) peel strength (in kg/cm) was measured. Resistance to thermal deterioration was measured in terms of the deterioration rate (%) of the peel strength after heating at 180° for 48 hours. Resistance to hydrochloric acid was given as the deterioration rate (%) of the peel strength of a 0.2 mm-pitch circuit measured after immersion in 18% hydroChloric acid for one hour.

Alkali etching or etchability was evaluated upon Visual observation of each sample etched with the aforementioned alkali etchant.

The results are summarized in the following Tables 1 and 2.

TABLE 1

| Evaluation item | This invention Cu—Co | Comparative Example Cu—Co | Comparative Example Cu-roughened |
|---|---|---|---|
| Analytical values:* | | | |
| Co | 1000 (4%) | 28000 (93)% | — |
| Cu | 27000 (96%) | 2000 (7%) | (100%) |
| Peel strengths: | | | |
| normal, kg/cm | 1.25 | 1.10 | 1.20 |
| thermal deterioration resistance | 55% | 65% | 80% |
| HCl deterioration resistance | 10% | 15% | 25% |
| Magnetic properties: | | | |
| $M_s$, emu/cc | 40 | 1300 | — |
| $M_r$, emu/cc | 30 | 700 | — |
| $H_c$, Oe | 200 | 500 | — |
| Alkali etching | Good | Good | Good |

*in unit of µg/dm$^2$, the values in parentheses in percent by weight.

TABLE 2

| Evaluation item | Comparative example Cu—Ni | Comparative example Cu—Co | This invention Cu—Ni—Co | Comparative example Cu-roughened |
|---|---|---|---|---|
| Analytical values:* | | | | |
| Ni | 15000 (50%) | — | 350 (1%) | — |
| Co | — | 28000 (93%) | 1100 (4%) | — |
| Cu | 15000 (50%) | 2000 (7%) | 27000 (95%) | (100%) |
| Peel strengths: | | | | |
| normal, kg/cm | 1.20 | 1.10 | 1.25 | 1.25 |
| thermal deterioration resistance | 30% | 65% | 30% | 80% |
| HCl deterioration resistance | 6% | 15% | 7% | 25% |
| Magnetic properties: | | | | |
| $M_s$, emu/cc | 160 | 1300 | 40 | — |
| $M_r$, emu/cc | 70 | 700 | 30 | — |
| $H_c$, Oe | 250 | 500 | 200 | — |
| Alkali etching | Poor | Good | Good | Good |

*in the unit of µg/dm$^2$, the values in parentheses in percent by weight.

ADVANTAGES OF THE INVENTION

This invention provides a process for treating a copper foil so that it can keep up with the recent tendencies toward higher density and greater multiplication of layers of printed circuits with the rapid progress in the art of semiconductor devices. The copper foil treated in accordance with the invention has good peel strength even after heating and immersion into hydrochloric acid. It can be etched with a CuCl$_2$ etchant provide 150µm or finer-pitch printed circuits and is also etchable with alkalies. With regard to the magnetic properties of increasing importance, its magnetizability is successfully reduced below the permissible upper limit. The copper foil of the invention is particularly suited for use in fine-pattern printed circuits and flexible printed circuits for magnetic heads.

What is claimed is:

1. A process for the treatment of a copper foil for printed circuits characterized by forming, on the surface of the copper foil to be treated, an electroplated alloy layer selected from the group consisting of electro-plated layers of binary alloys composed of from 20 to 40 mg/dm² copper and from 100 to 3000 μg/dm² cobalt and ternary alloys composed of from 20 to 40 mg/dm² copper, from 100 to 3000 μg/dm² cobalt, and from 100 to 1000μg/dm² nickel.

2. A process according to claim 1 wherein the electroplated layer formed is then treated for corrosion prevention.

3. A process according to claim 2 wherein the treatment for corrosion prevention is coating with either chromium oxide alone or with a mixture of chromium oxide and zinc/zinc oxide.

4. A process according to anyone of claims 1 to 3 wherein the surface of the copper foil is roughened as pre-treatment before forming said electroplated alloy layer.

* * * * *